(12) United States Patent
Lin et al.

(10) Patent No.: US 6,194,271 B1
(45) Date of Patent: Feb. 27, 2001

(54) METHOD FOR FABRICATING FLASH MEMORY

(75) Inventors: Chih-Hung Lin; Joe Ko, both of Hsinchu (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/237,295

(22) Filed: Jan. 25, 1999

(51) Int. Cl.[7] ................................................. H01L 21/8247
(52) U.S. Cl. ............................ 438/259; 438/296; 438/589
(58) Field of Search ................................... 438/257, 259, 438/264, 270, 296, 424, 589

(56) References Cited

U.S. PATENT DOCUMENTS 5,559,048 * 9/1996 Inoue ..................................... 438/259
5,770,501 * 6/1998 Hong ..................................... 438/296

OTHER PUBLICATIONS

Ghandi, pp. 420–422, 427–429, 432–434, 1983.*

* cited by examiner

Primary Examiner—Chandra Chaudhari
(74) Attorney, Agent, or Firm—Jiawei Huang; J C Patents

(57) ABSTRACT

A method of fabricating a flash memory. A gate is formed on a provided substrate. A first doping process is performed. A patterned mask layer is formed over the substrate. A shallow trench isolation structure is formed in the substrate by using the gate and the mask layer as a mask. A portion of the substrate defined below the gate is a first active region and a portion of the substrate defined below the mask layer is a second active region. The mask layer is removed. A dielectric layer and a conductive layer are formed in sequence over the substrate. The conductive layer, the dielectric layer and the gate are patterned to form a control gate and a floating gate, wherein a portion of the control gate overlap with the second active region. A second doping process is performed.

19 Claims, 13 Drawing Sheets

METHOD FOR FABRICATING FLASH MEMORY

BACKGROUND OF THE INVENTION

1. Field of the Invention

The present invention relates to a method of fabricating a memory device. More particularly, the present invention relates to a method for fabricating a flash memory.

2. Description of the Related Art

Conventional flash memory is a type of erasable programmable read-only memory (EPROM). There have been many articles written about flash memories. In general, the gate of a flash memory includes a polysilicon floating gate, which is used for storing electric charges, and a control gate, which is used for controlling data access. Therefore, EPROM normally has two gate terminals with the floating gate located below the control gate. The control gate and the word line are usually connected, and the floating gate is usually in a "floating" state. In other words, the floating gate is not in contact with any other circuits. An outstanding property of flash memory is its ability to perform a fast, block-by-block memory erase instead of the slow, bit-by-bit memory erase as in conventional EPROM. Consequently, operation speed of a flash memory is very fast. Often, the entire memory can be erased within one or two seconds.

FIGS. 1A through 1C are schematic, top view diagrams used to depict steps in a conventional method for fabricating a flash memory. FIGS. 2A through 2C are schematic, cross-sectional views of FIGS. 1A through 1C along a line II—II.

Referring to FIGS. 1A and 2A, a shallow trench isolation structure 102 is formed in a provided substrate 100 to define an active region 104.

Referring to FIGS. 1B and 2B, a tunneling oxide layer 106 and a patterned gate conductive layer 108 are formed in sequence on the active region 104.

Referring to FIGS. 1C and 2C, a silicon-oxy-nitride layer 110 and a polysilicon layer 112 are formed in sequence on the gate conductive layer 108 by chemical vapor deposition. The polysilicon layer 112, the silicon-oxy-nitride layer 110 and the gate conductive layer 108 are patterned to form a gate 114, wherein the polysilicon layer 112 is a control gate and the conductive layer 108 is a floating gate. An ion implantation process is performed to form a source/drain region 116, 118 in the substrate 100.

FIG. 3 is a schematic, top view of FIG. 1C.

Referring to FIG. 3, the shallow trench isolation structure 102 and the active region 104 are formed before forming the gate conductive layer 108. Thus, a misalignment problem occurs while forming the gate conductive layer 108. In general, the width 124 of the gate conductive layer 108 is formed larger than the one of the active region 104, so that the edge of the conductive layer 108 overlaps with the shallow trench isolation structure 102 (denoted by the reference numeral 120). The misalignment problem is avoided, however it is difficult to increase the integration of the devices.

Similarly, the misalignment problem also occurs while forming the polysilicon layer 112. The area overlapped by the active region 104 and the conductive layer 108 is changed because of the misalignment problem (denoted by the reference numeral 122). Thus, the coupling ratio of the adjacent memory cells is different. An odd-even effect occurs.

In order to increase the integration of the devices, the distance 128 between the shallow trench isolation structures 102 must be shorter. However, the source/drain region 116 is smaller when the distance 128 between the shallow trench isolation structures 102 is shorter. Thus, the resistance of the source/drain region 116 is increased. Also, the distance 126 between the polysilicon layers 112 is limited by the distance 128 between the shallow trench isolation structures 102, and it is difficult to increase the integration of the devices.

SUMMARY OF THE INVENTION

Accordingly, the purpose of the present invention is to provide a method for fabricating a flash memory that avoids the misalignment problem and the odd-even effect.

To achieve these and other advantages and in accordance with the purpose of the invention, as embodied and broadly described herein, the invention provides a method for fabricating a flash memory. The method for fabricating this flash memory includes the following steps. A tunneling oxide layer, a first conductive layer, a first mask layer and a first oxide layer are formed in sequence on a provided substrate. The first conductive layer, the first mask layer and the first oxide layer are patterned to form a gate. A conformal, second oxide layer is formed over the substrate. A spacer is formed on the second oxide layer. A first doping process is performed by using the gate, the second oxide layer and the spacer as a mask to form a first doped region in the substrate. The spacer is removed. A patterned second mask layer is formed over the substrate, wherein the second mask layer crosses the gate vertically. A shallow trench isolation structure is formed by using the gate and the second mask layer as a mask. A first active region and a second active region are formed. The first mask layer and the second mask layer are removed to expose the first conductive layer. A dielectric layer and a second conductive layer are formed over the substrate. The second conductive layer, the dielectric layer and the gate are patterned to form a control gate and a floating gate, wherein a portion of the control gate overlap with the second active region. A second doping process is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
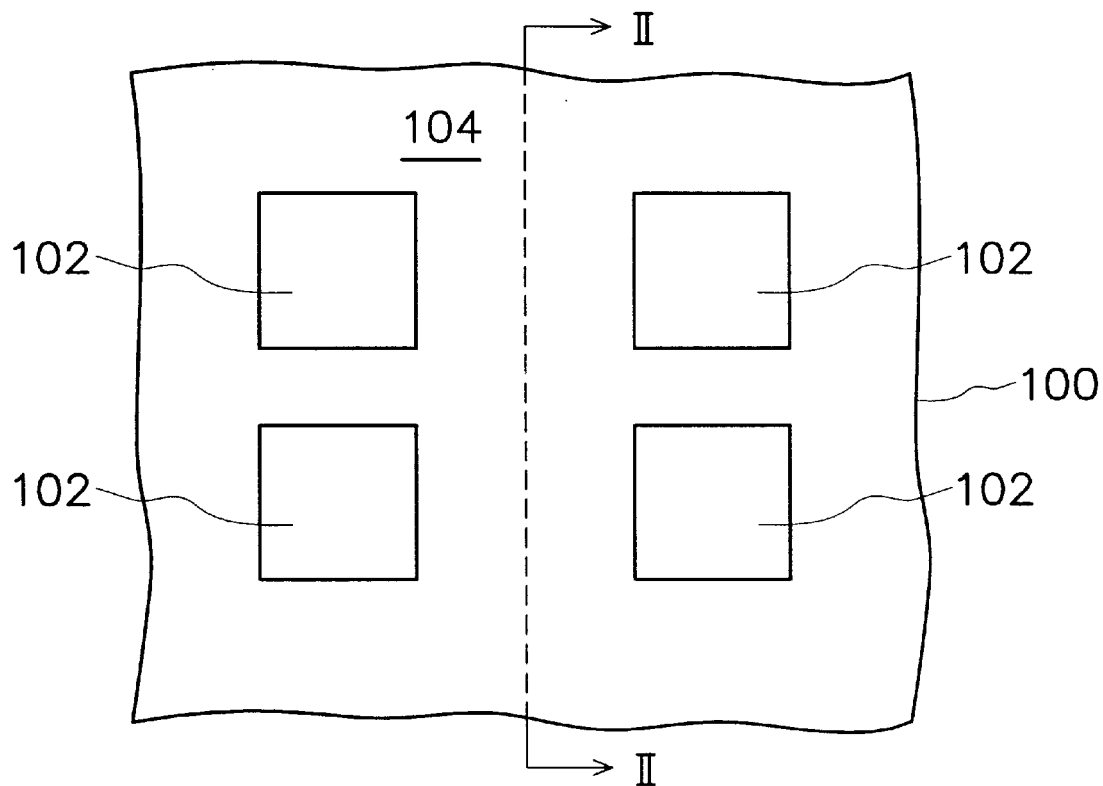
FIGS. 1A through 1C are schematic, top view diagrams used to depict steps in conventional method for fabricating a flash memory.
Figure 2A:
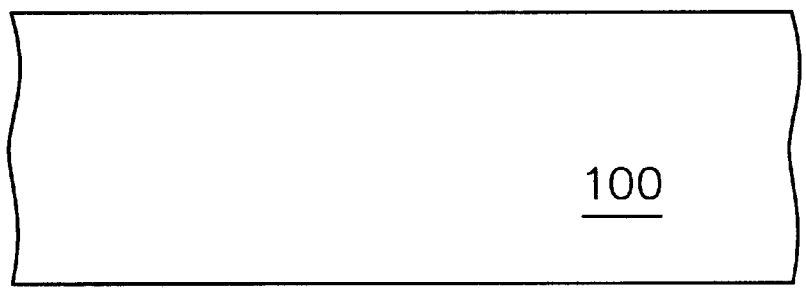
FIGS. 2A through 2C are schematic, cross-sectional views of FIGS. 1A through 1C along a line II—II.
Figure 1B:
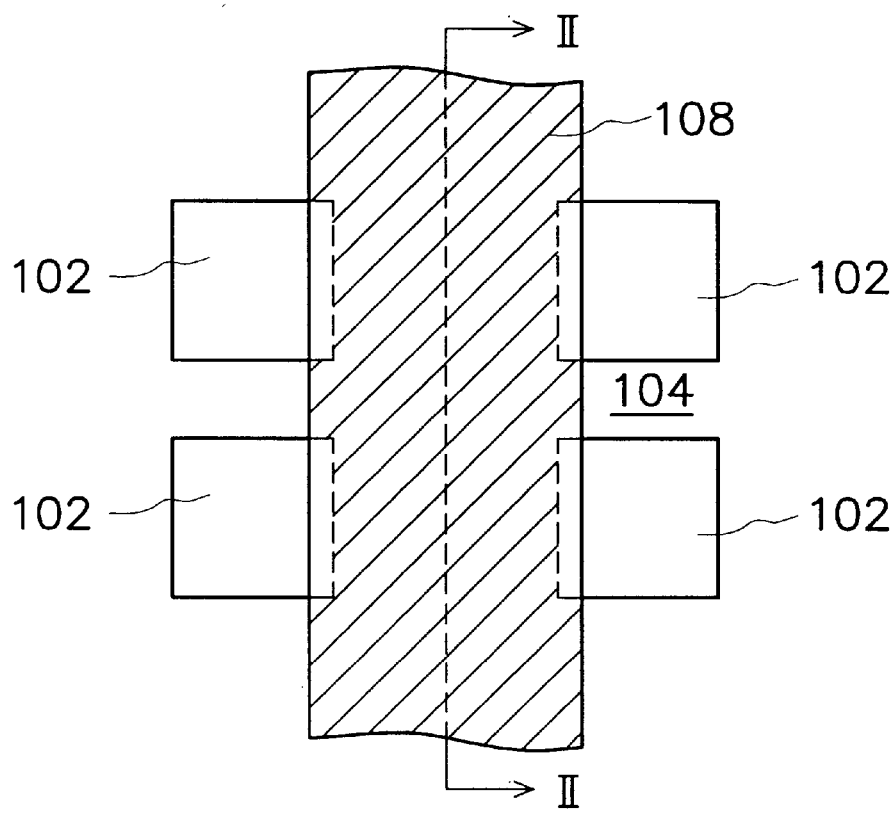
Figure 2B:
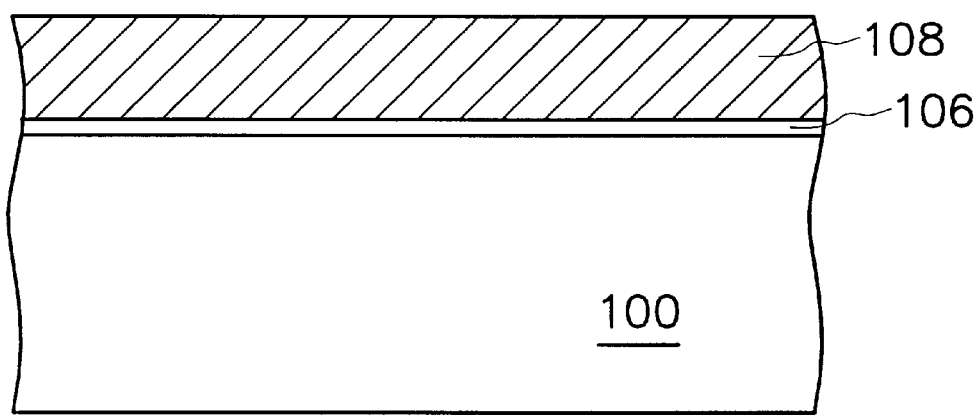
Figure 1C:
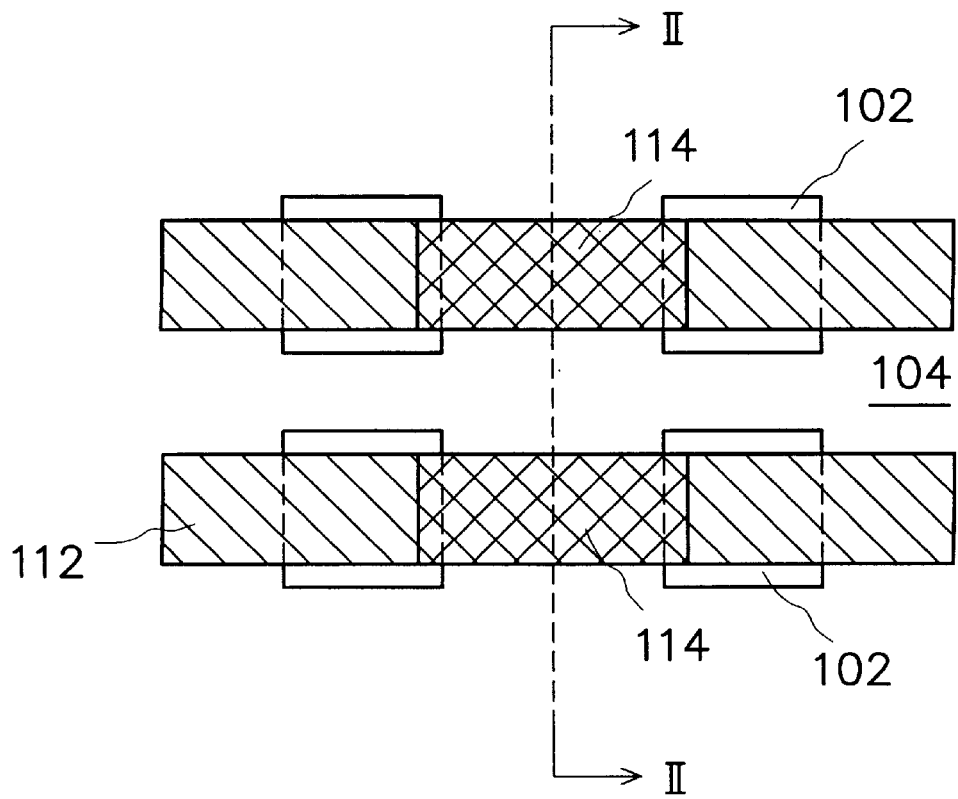
Figure 2C:
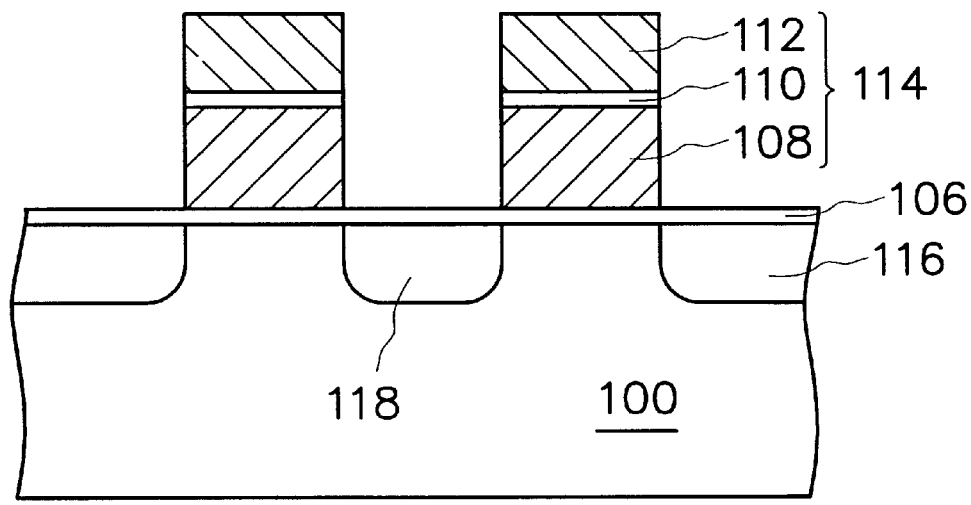
Figure 3:
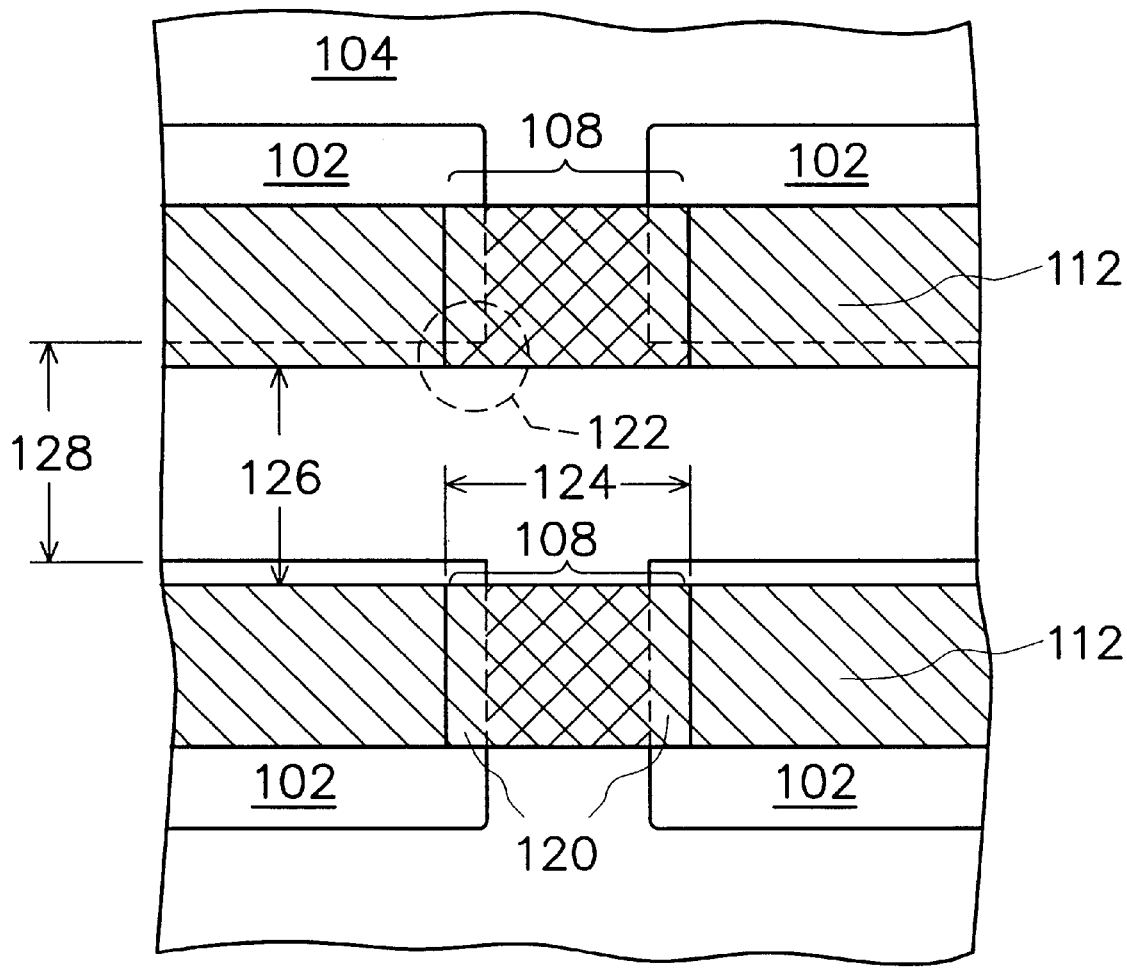
FIG. 3 is a schematic, top view of FIG. 1C.

Reference will now be made in detail to the present preferred embodiments of the invention, examples of which are illustrated in the accompanying drawings. Wherever possible, the same reference numbers are used in the drawings and the description to refer to the same or like parts.

Figure 6:
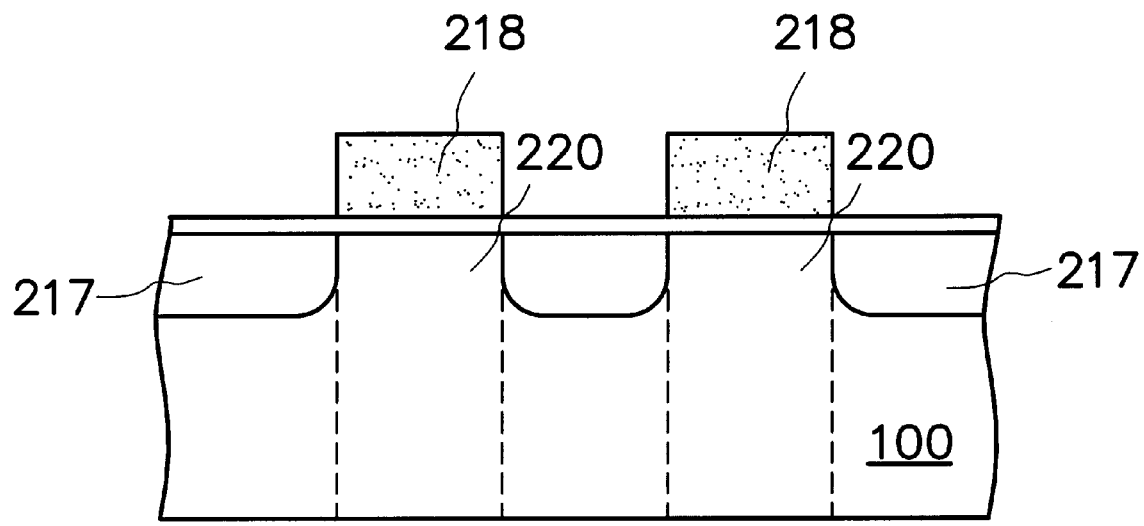
FIG. 6 is a schematic, cross-sectional view of FIG. 4D along a line VI—VI.
Figure 7:
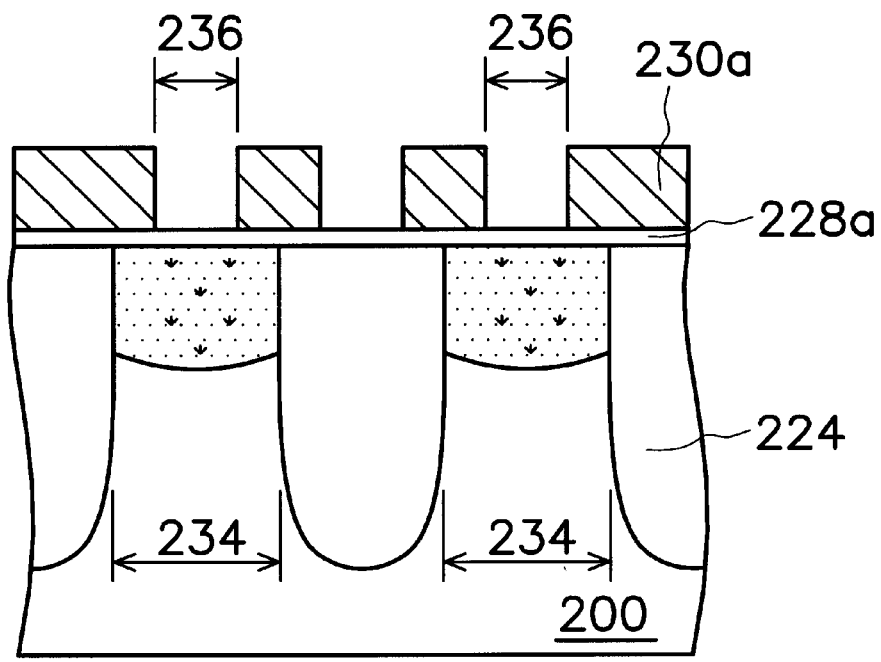
FIG. 7 is a schematic, cross-sectional view of FIG. 4H along a line VII—VII.

FIGS. 4A through 4H are schematic, top view diagrams used to depict steps in a method according to the invention for fabricating a flash memory. FIGS. 5A through 5H are schematic, cross-sectional views of FIGS. 4A through 4C along a line V—V. FIG. 6 is a schematic, cross-sectional view of FIG. 4D along a line VI—VI. FIG. 7 is a schematic, cross-sectional view of FIG. 4H along a line VII—VII.

Figure 4A:
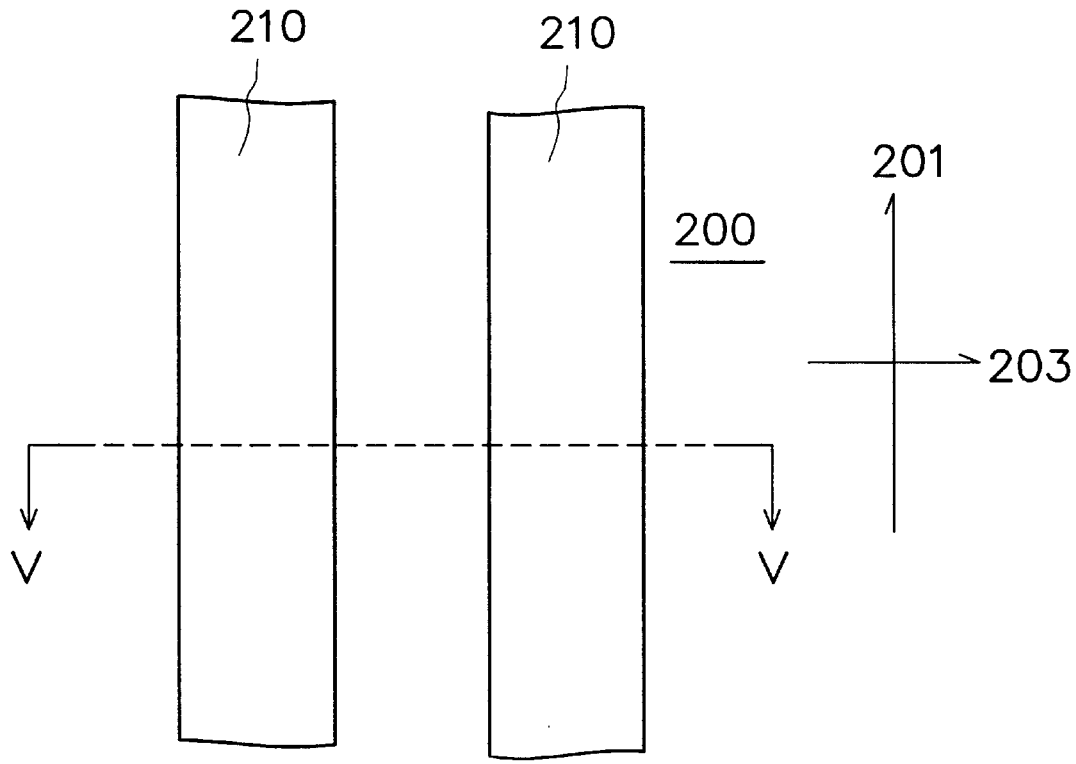
FIGS. 4A through 4H are schematic, top view diagrams used to depict steps in a method according to the invention for fabricating a flash memory.
Figure 5A:
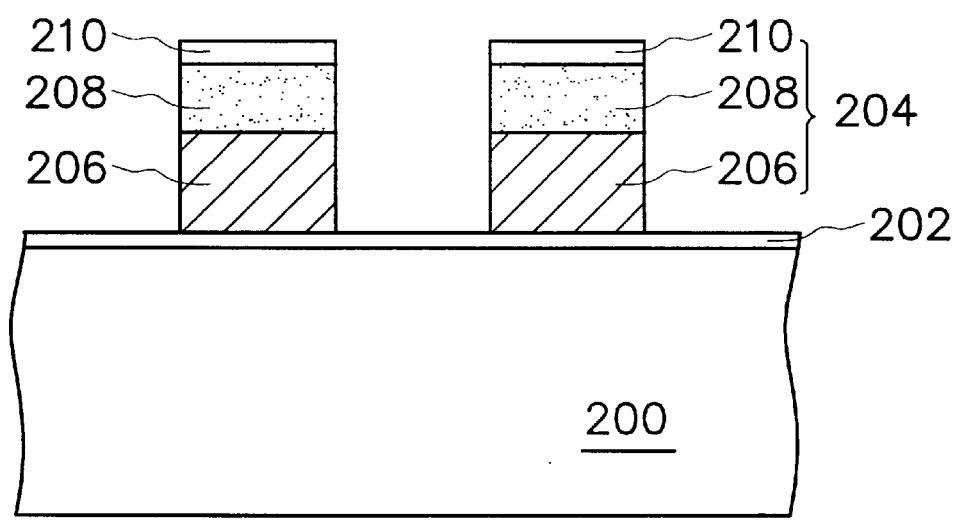
FIGS. 5A through 5H are schematic, cross-sectional views of FIGS. 4A through 4H along a line V—V.

Referring to FIGS. 4A and 5A, a substrate 200 is provided. A tunneling oxide layer 202 is formed on the substrate 200 by, for example, thermal oxidation. A gate 204 is formed on the tunneling oxide layer 202 and the gate 204 is parallel to a column direction 201. The step of forming the gate 204 includes forming a conductive layer (not shown), a mask layer (not shown) and an oxide layer (not shown) in sequence over the substrate 200 and patterning the conductive layer, the mask layer and the oxide layer.

Figure 4B:
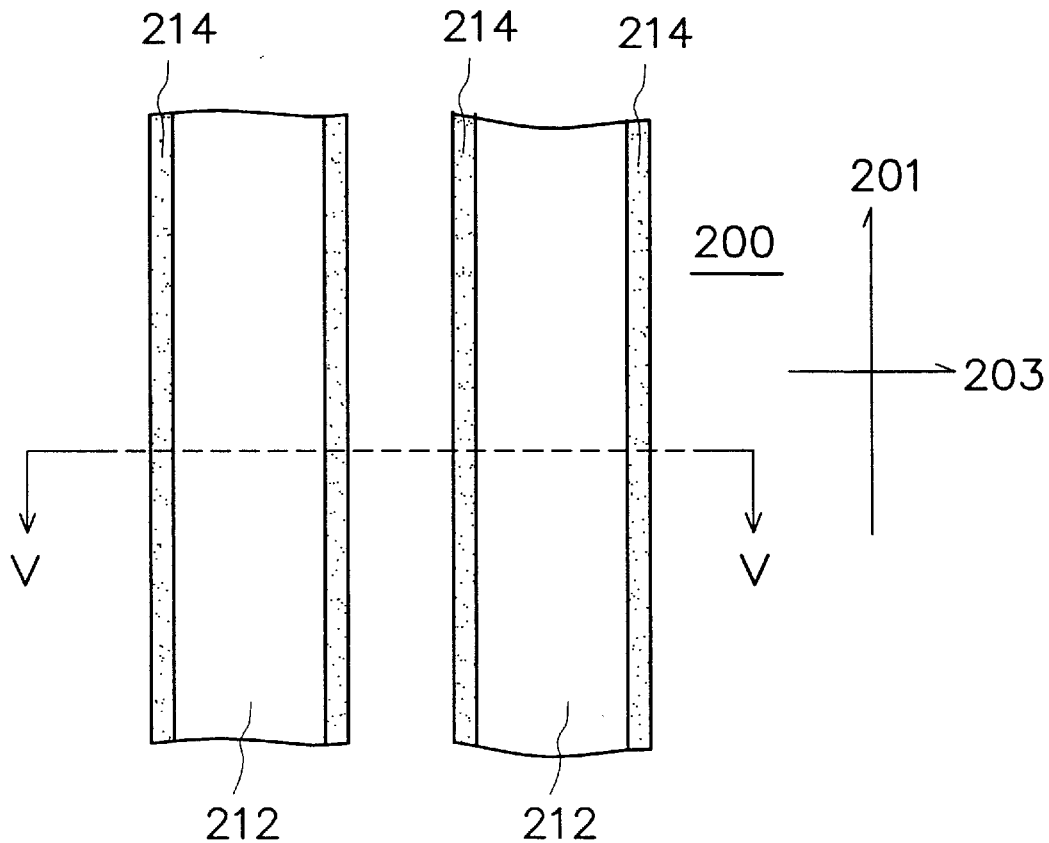
Figure 5B:
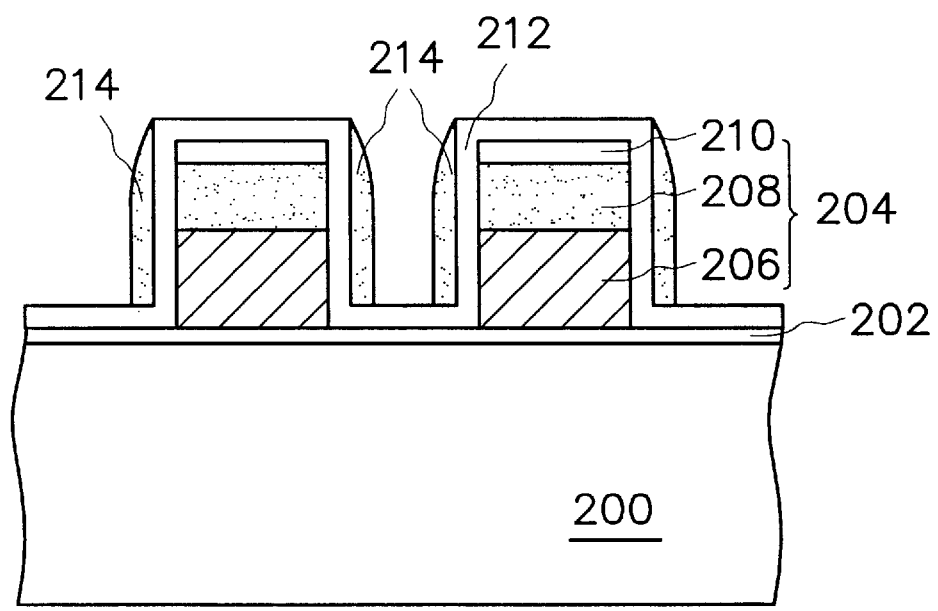

Referring to FIGS. 4B and 5B, a conformal oxide layer 212 is formed over the substrate 200 by, for example, chemical vapor deposition. A spacer 214 is formed on a portion of the oxide layer 212 on the sidewall of the gate 204. The spacer 214 includes silicon nitride.

Figure 4C:
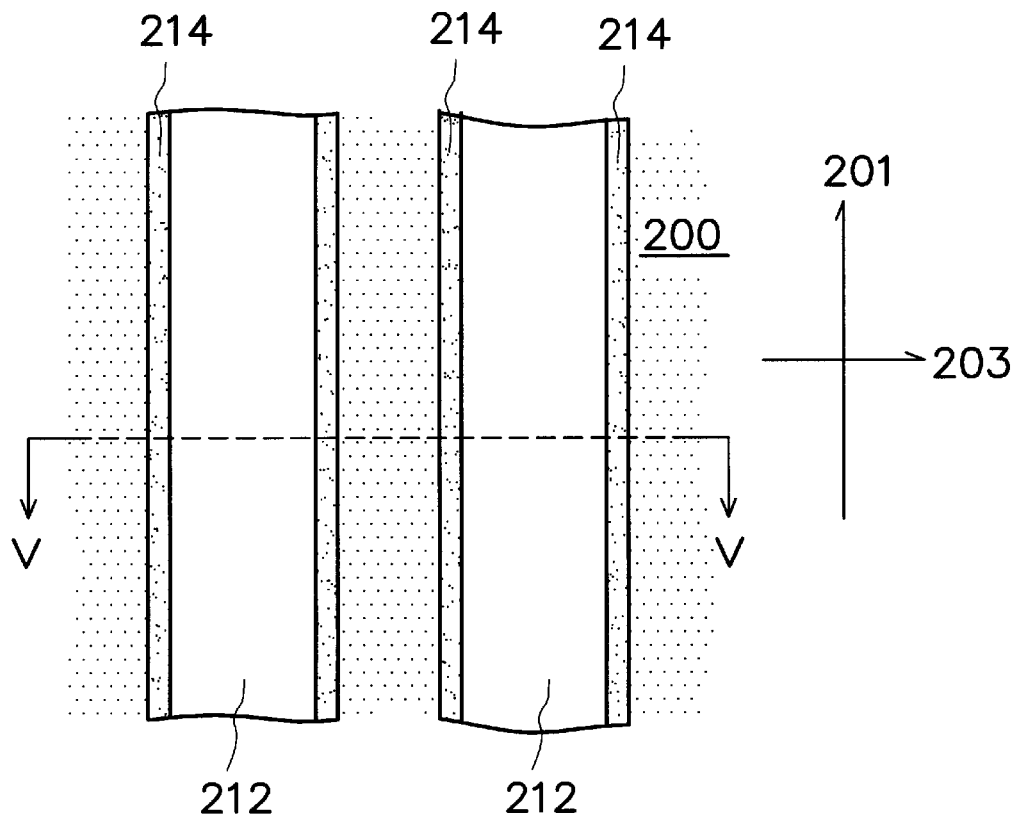
Figure 5C:
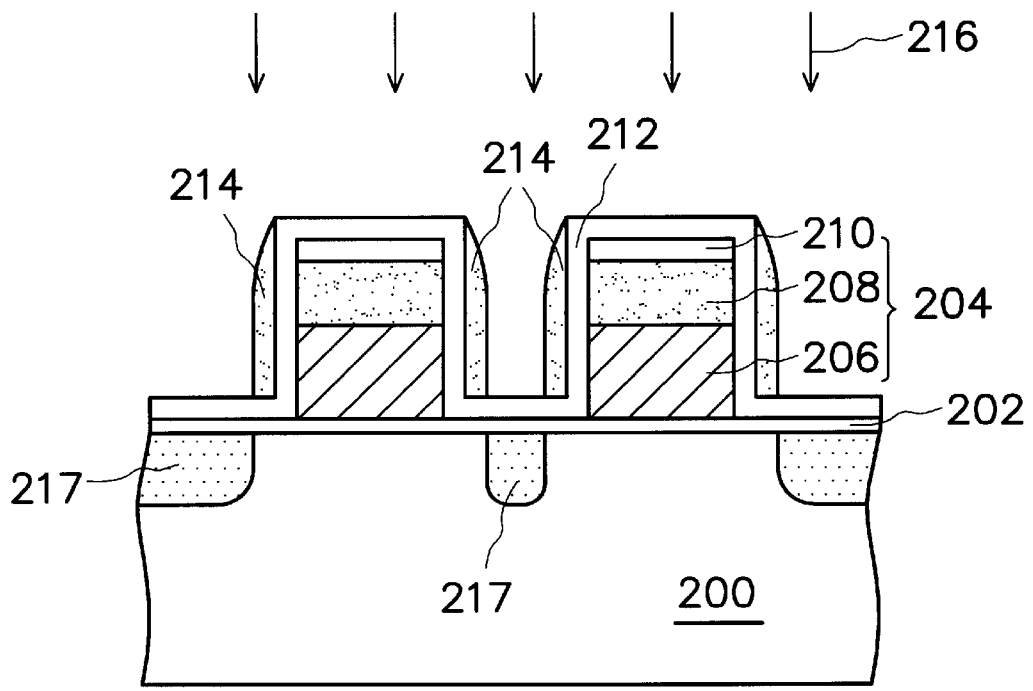

Referring to FIGS. 4C and 5C, a doping process 216 is performed by using the gate 204, a portion of the oxide layer 212 on the sidewall of the gate 204 and the spacer 214 as a mask to form a doped region 217 in the substrate 200. The doping process includes ion implantation. The dopant includes phosphorus or arsenic. Preferably, the implantation depth is about 500 to 1500 Å.

Figure 4D:
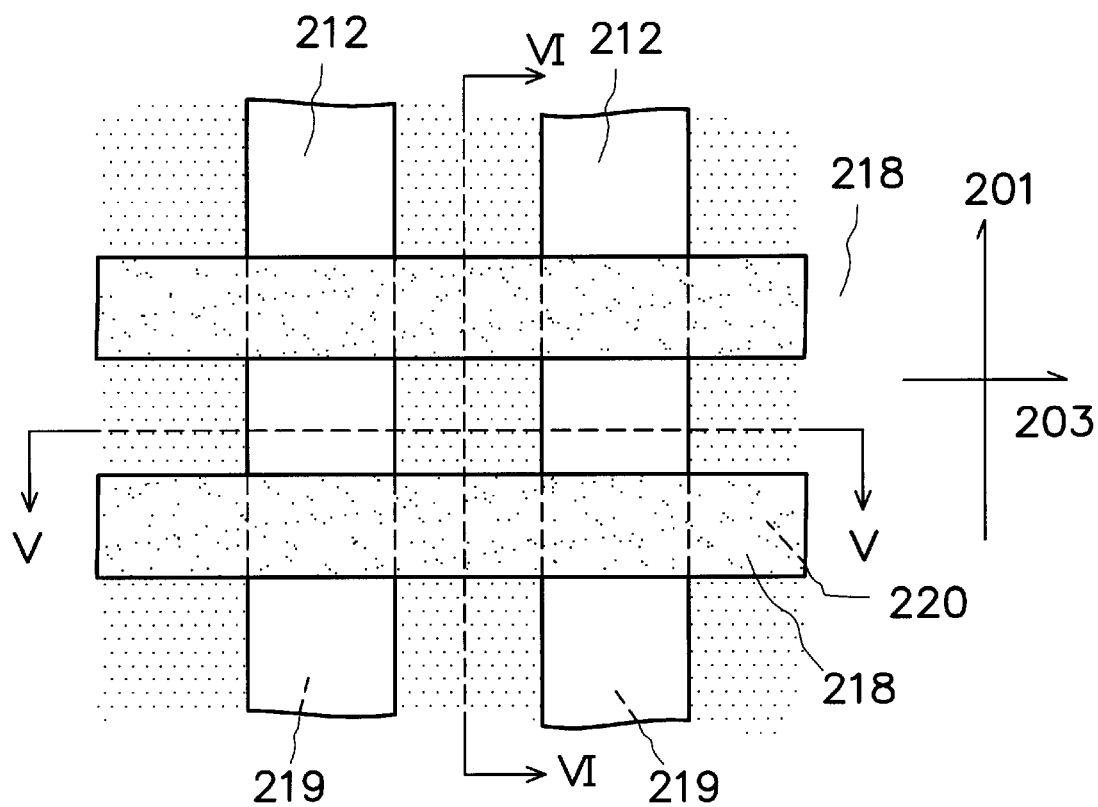
Figure 5D:
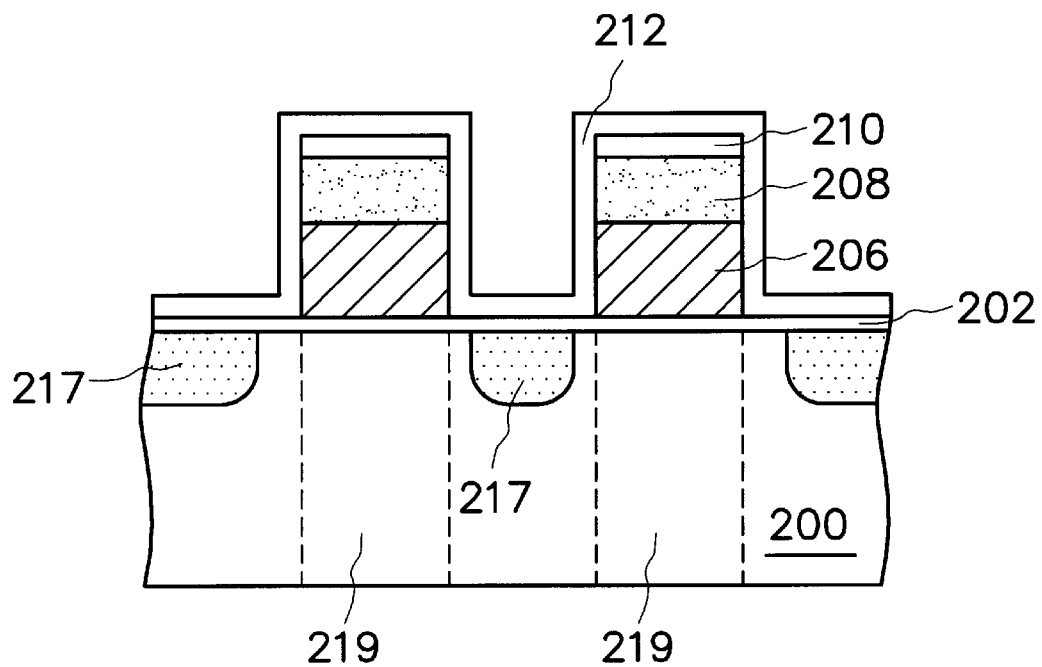

Referring to FIGS. 4D, 5D and 6, the spacer 214 is removed by, for example, wet etching. A patterned mask layer 218 is formed over the substrate 200, wherein the mask layer 218 is parallel to a row direction 203 perpendicular to the column direction 201, wherein the mask layer 218 crosses the gate 204. The mask layer 218 includes silicon nitride. A portion of the substrate 200 defined below the gate 204 is an active region 219 and a portion of the substrate 200 defined below the mask layer 218 is an active region 220. An active region includes the active region 219 and the active region 220.

Figure 4E:
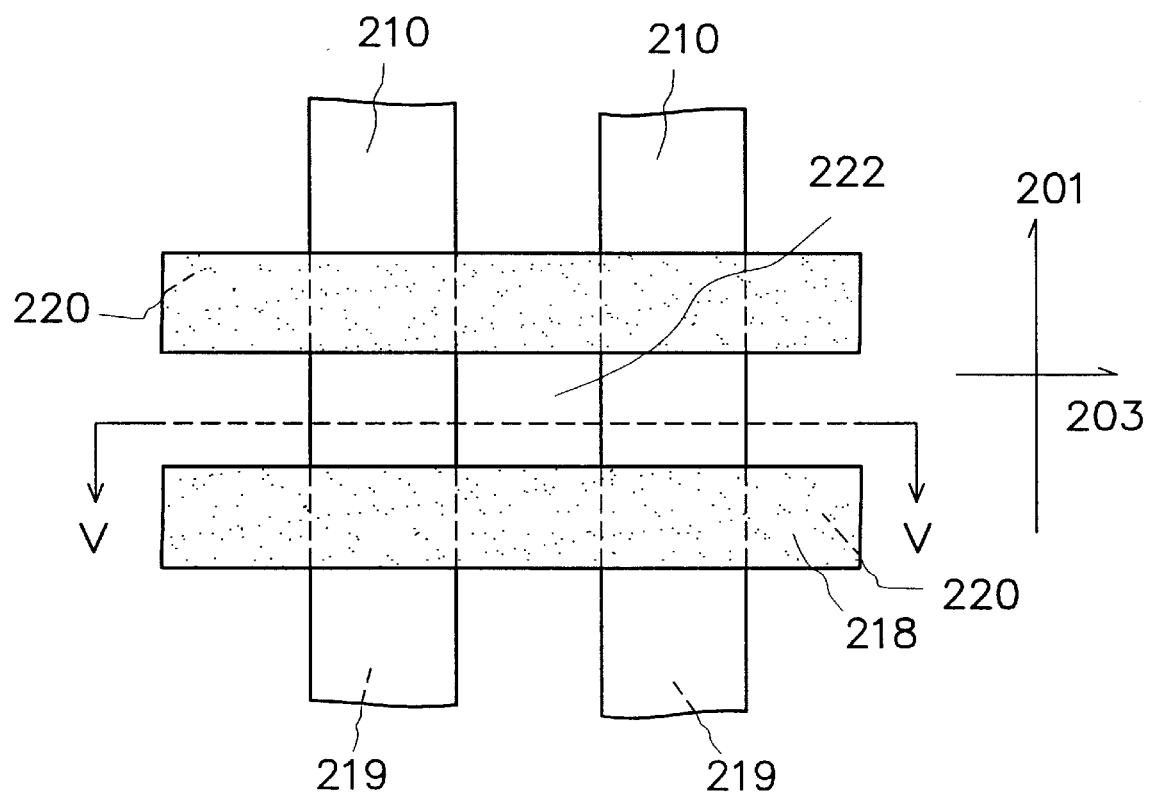
Figure 5E:
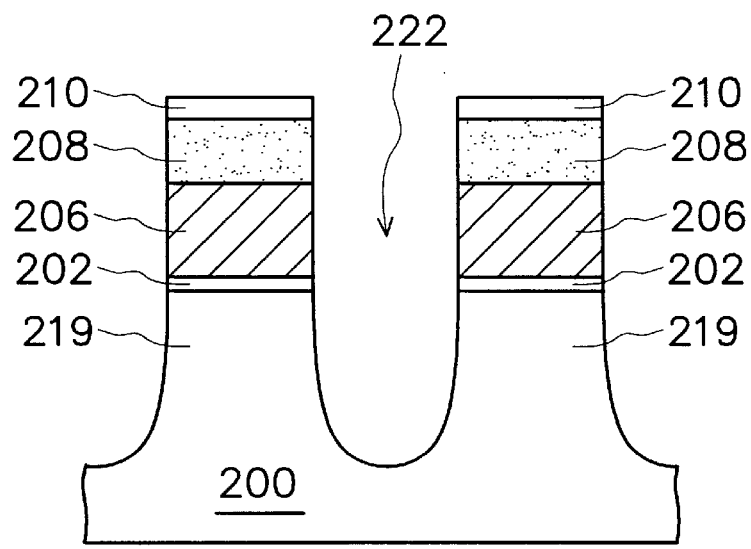

Referring to FIGS. 4E and 5E, a trench 222 is formed in the substrate 200 exposed by the gate 204 and the mask layer 218.

Figure 4F:
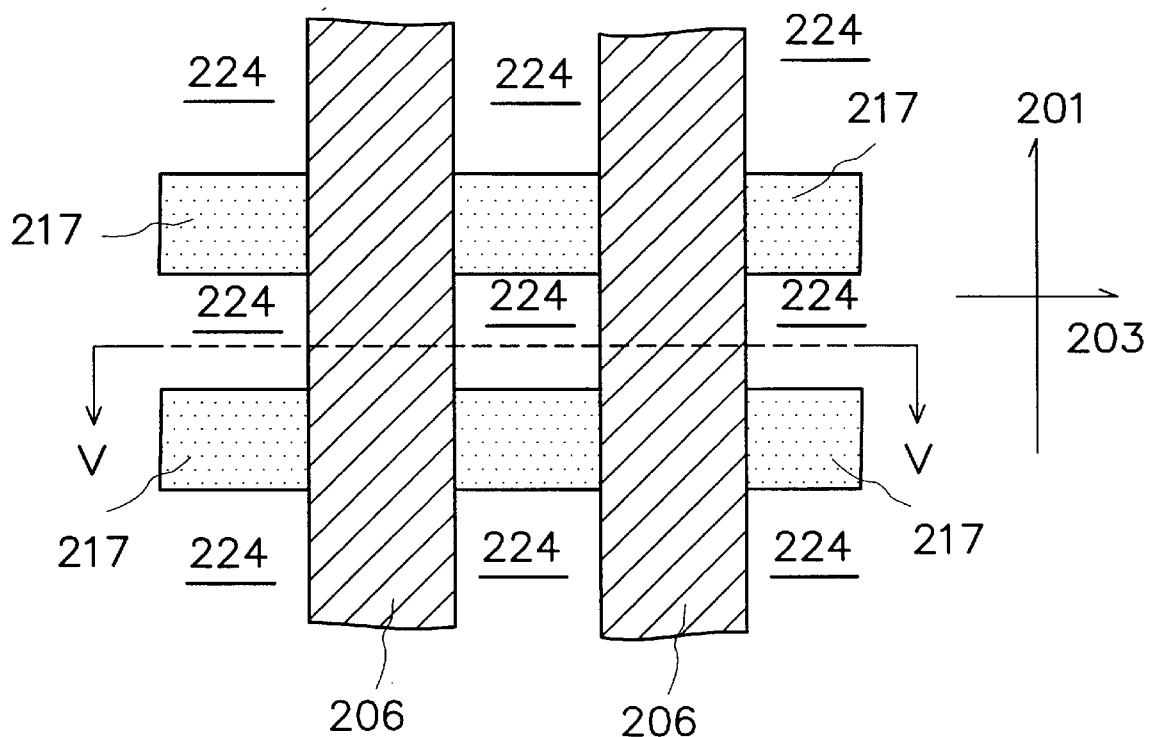
Figure 5F:
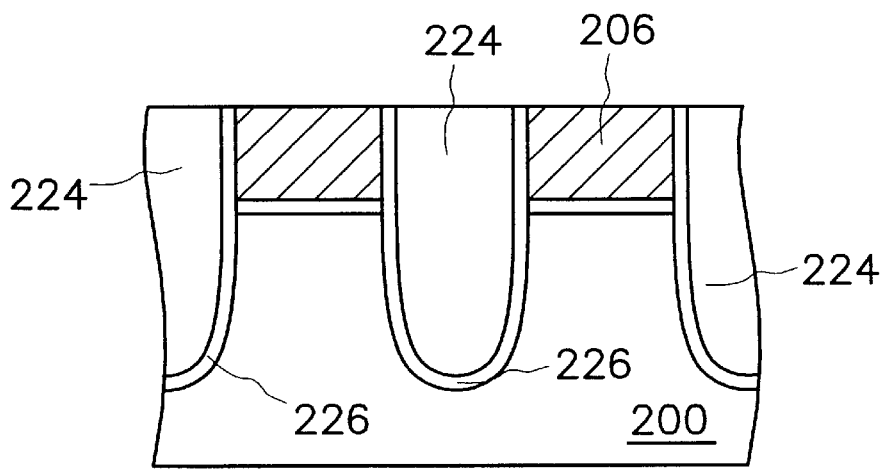

Referring to FIGS. 4F and 5F, a shallow trench isolation structure 224 is formed in the trench 222. The mask layer 218, the oxide layer 210 and the mask layer 208 are removed to expose the conductive layer 206. The method of forming the shallow trench isolation structure 224 includes the following steps. A liner oxide layer 226 is formed within the trench 222. An oxide layer (not shown) is formed over the substrate 200 and fills the trench 222. A portion of the oxide layer is removed to expose the oxide layer 210, so that the shallow trench isolation structure 224 is formed. The step of removing the mask layer 218, the oxide layer 210 and the mask layer 208 includes wet etching.

The steps shown in FIGS. 4E and 4F are used to define the active region and the isolation region. The active region is formed by using the gate 204 and the mask layer 218 as a mask. Thus, the gate 204 is aligned over the active region 219 and the mask layer 218 is aligned over the active region 220. In other words, the active region is self-aligned and the shallow trench isolation structure 224 is also self-aligned. The misalignment problem is avoided.

Figure 4G:
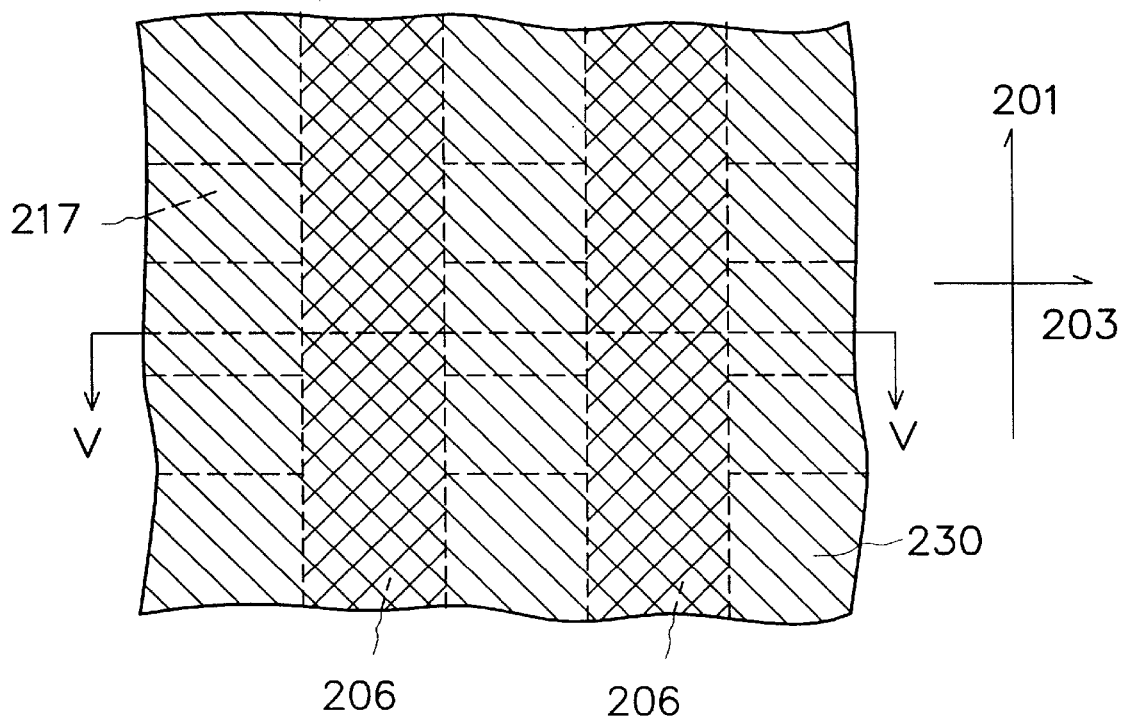
Figure 5G:
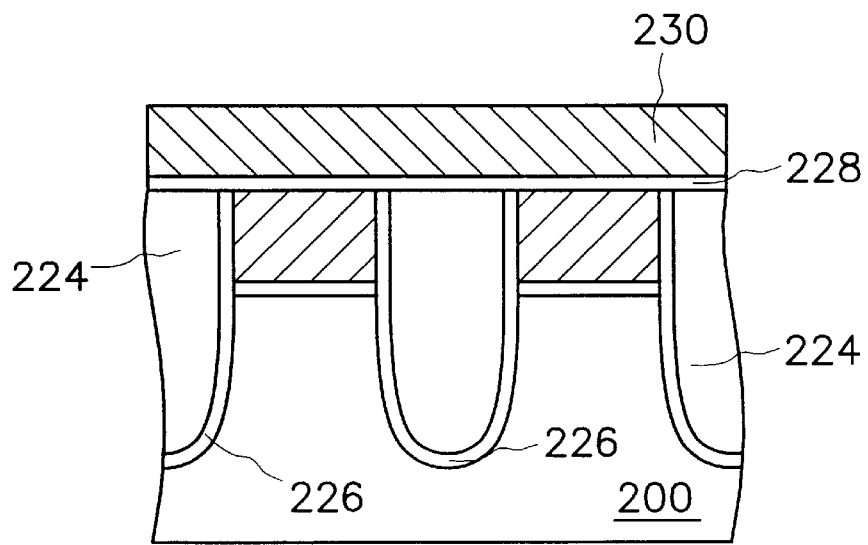

Referring to FIGS. 4G and 5G, a dielectric layer 228 is formed over the substrate 200. The dielectric layer 228 includes silicon-oxy-nitride. A conductive layer 230 is formed on the dielectric layer 228 by, for example, chemical vapor deposition.

Figure 4H:
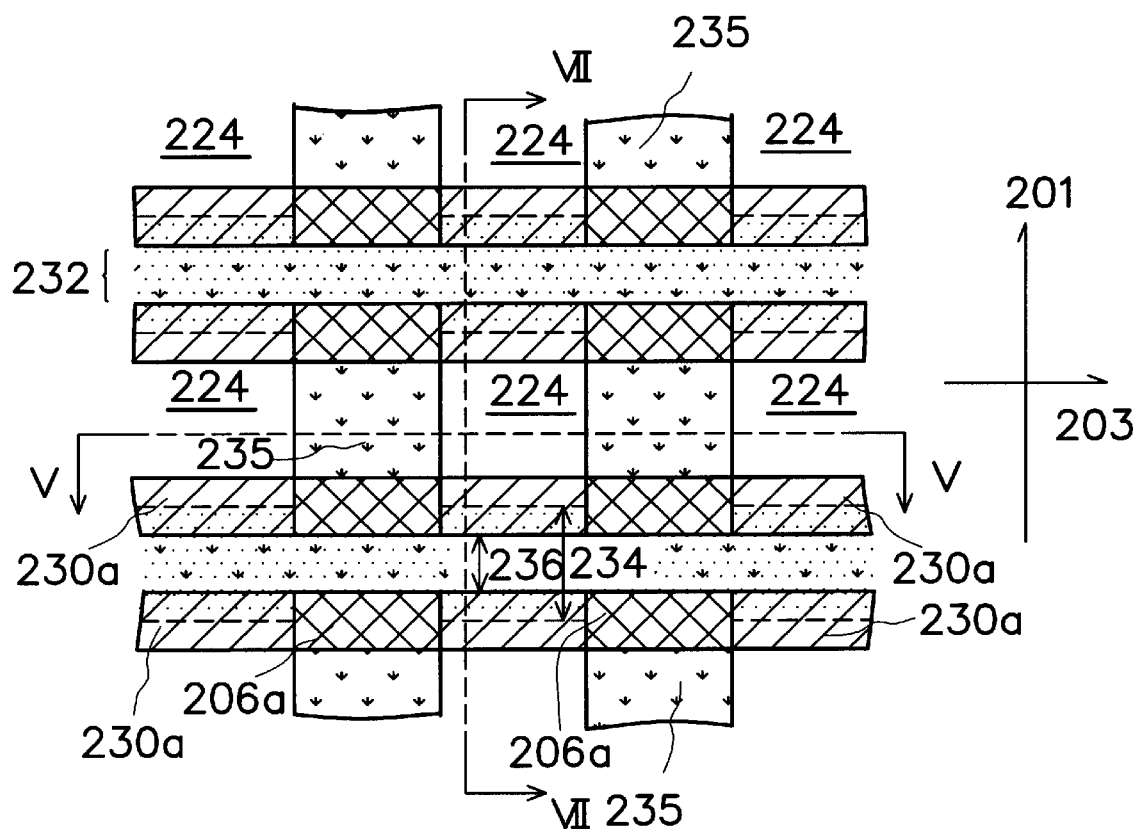
Figure 5H:
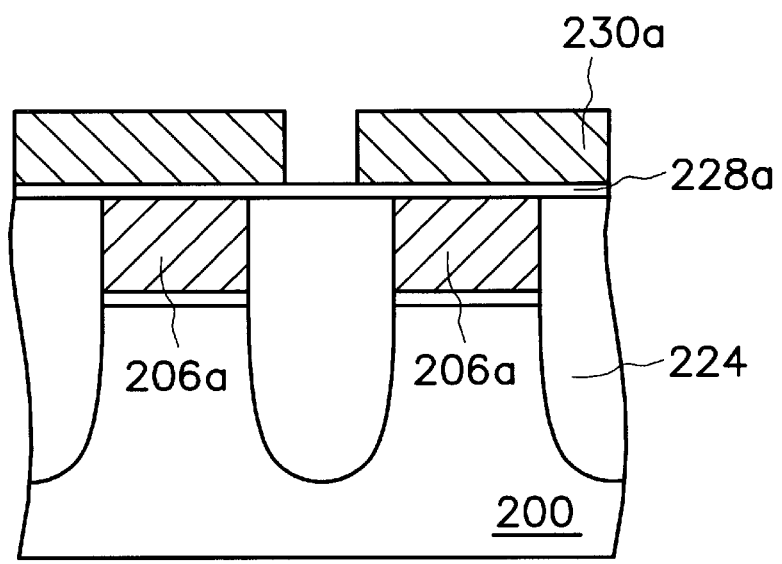

Referring to FIGS. 4H and 5H, the conductive layer 230, the dielectric layer 228 and the conductive layer 206 are patterned to form a control gate 230a and a floating gate 206a under the control gate 230a, wherein the control gate 230a is parallel to the row direction 203. A portion of the control gate 230a overlaps with the active region 220. A dielectric layer 228a is formed between the control gate 230a and the floating gate 206a. A doping process is performed. A source/drain region 235 is formed in the active region 219 exposed by the control gate 230a. A common source/drain structure 232 is formed in the active region 220 exposed by the control gate 230a.

In the invention, the active region and the gate 204 are formed simultaneously. Even if the misalignment occurs while forming the control gate 230a, the area overlapped by the floating gates 206a and the substrate 200 is not changed. The odd-even effect is avoided.

Referring to FIGS. 4H and 7, the width 234 of the active region 220 is determined before forming the control gate 230a. The distance 236 between the control gates 230a is not limited by the width 234 of the active region 220. Thus, the distance 236 between the control gates 230a can be less than the width 234 of the active region 220. The resistance of the common source/drain region 232 is not increased. The integration of the devices is increased.

According to the foregoing, the advantages of the invention include the following:

1. The active region and the isolation region are all formed in self-aligned processes. The misalignment problem is avoided.
2. The distance between the control gates can be less than the distance of the isolation region. The integration of devices is increased.
3. When the misalignment problem occurs, the area overlapped by the control gate and the floating gate is not changed. Thus, the coupling ratio is not changed. The odd-even effect is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a flash memory, comprising the steps of:
   providing a substrate;
   forming a gate which is parallel to a column direction on the substrate, wherein the gate is covered by a first mask layer;
   performing a first doping process by using the gate as a mask to form a source/drain region in the substrate;
   forming a patterned, second mask layer over the substrate, wherein the second mask layer is parallel to a row direction perpendicular to the column direction, and crosses the gate;

forming a block-shaped shallow trench isolation structure in the substrate exposed by the gate and the second mask layer, wherein each block-shaped shallow trench isolation structure is not connected to any other shallow trench isolation structure and wherein a portion of the substrate defined below the gate is a first active region and a portion of the substrate defined below the second mask layer is a second active region;

removing the first mask layer and the second mask layer;

forming a dielectric layer over the substrate;

forming a conductive layer on the dielectric layer;

patterning the conductive layer, the dielectric layer and the gate to form a control gate and a floating gate under the control gate, wherein the control gate is parallel to the row direction; and performing a second doping process to form a common source/drain region in the substrate.

2. The method of claim 1, wherein the first mask layer and the second mask layer include silicon nitride.

3. The method of claim 1, wherein the conductive layer includes polysilicon.

4. The method of claim 1, wherein a first oxide layer is formed on the first mask layer.

5. The method of claim 1, comprising the steps of forming a conformal second oxide layer over the substrate before performing first doping process; and forming a spacer on a portion of the second oxide layer on the sidewall of the gate.

6. The method of claim 5, wherein the spacer includes silicon nitride.

7. The method of claim 5, wherein the spacer is removed after performing the first doping process.

8. The method of claim 1, wherein a portion of the control gate overlaps with a portion of the second active region.

9. The method of claim 1, wherein the first doping process and the second doping process include ion implantation.

10. The method of claim 1, wherein the step of removing the first mask layer and the second mask layer includes wet etching.

11. The method of claim 1, wherein the step of forming the block-shaped shallow trench isolation structure comprises:

performing an anisotropic etching process by using the gate and the second mask layer as a mask to form a trench in the substrate;

forming a liner oxide layer within the trench;

forming a third oxide layer over the substrate that fills the trench; and removing a portion of the third oxide layer.

12. A method for fabricating a flash memory, comprising the steps of:

providing a substrate;

forming a first conductive layer and a first mask layer in sequence on the substrate;

patterning the first conductive layer and the first mask layer to form a gate;

performing a first doping process to form a source/drain region in the substrate by using the gate as a mask;

forming a patterned, second mask layer over the substrate, wherein the second mask layer crosses the gate vertically;

forming a block-shaped shallow trench isolation structure in the substrate exposed by the gate and the second mask layer, wherein the block-shaped shallow trench isolation structure is not connected to any other shallow trench isolation structure and wherein a portion of the substrate defined below the gate is a first active region and a portion of the substrate defined below the second mask layer is a second active region;

removing the first mask layer and the second mask layer;

forming a dielectric layer over the substrate;

forming a second conductive layer on the dielectric layer;

patterning the second conductive layer, the dielectric layer and the gate to form a control gate and a floating gate under the control gate, wherein a portion of the control gate overlaps with the second active region; and performing a second doping process to form a common source/drain region in the substrate.

13. The method of claim 12, wherein the first mask layer and the second mask layer include silicon nitride.

14. The method of claim 12, wherein the first conductive layer and the second conductive layer include polysilicon.

15. The method of claim 12, further comprising the steps of:

forming a conformal first oxide layer over the substrate after forming the gate; and forming a spacer on a portion of the first oxide layer on the sidewall of the gate.

16. The method of claim 15, wherein the spacer includes silicon nitride.

17. The method of claim 15, wherein the spacer is removed after performing the first doping process.

18. The method of claim 12, wherein the step of removing the first mask layer and the second mask layer includes wet etching.

19. The method of claim 1, wherein the step of forming the block-shaped shallow trench isolation structure comprises:

performing an anisotropic etching process by using the gate and the second mask layer as a mask to form a trench in the substrate;

forming a liner oxide layer within the trench;

forming a third oxide layer over the substrate that fills the trench; and removing a portion of the third oxide layer.

* * * * *